United States Patent [19]

Weibe et al.

[11] Patent Number: 4,891,250
[45] Date of Patent: Jan. 2, 1990

[54] ELECTRONIC COMPONENT OPERATING TEMPERATURE INDICATOR

[76] Inventors: Edward W. Weibe, 215 Magnolia Ave.; Shane S. Truffer, 7698 Briar La., both of Pasadena, Md. 21122

[21] Appl. No.: 156,842
[22] Filed: Feb. 17, 1988
[51] Int. Cl.$^4$ ............................................. C09K 19/00
[52] U.S. Cl. ...................................... 428/1; 428/209; 428/901; 428/913; 428/920; 174/68.5
[58] Field of Search .................... 428/1, 209, 901, 913, 428/920; 174/68.5

[56] References Cited

U.S. PATENT DOCUMENTS

| | | | |
|---|---|---|---|
| 3,002,385 | 10/1961 | Wahl et al. | 428/1 |
| 3,617,374 | 11/1971 | Hodson | 428/1 |
| 3,620,889 | 11/1971 | Baltzer | 428/1 |
| 3,661,142 | 5/1972 | Flam | 428/1 |
| 3,704,625 | 12/1972 | Seto et al. | 428/1 |
| 3,826,141 | 7/1974 | Pickett et al. | 428/1 |
| 3,893,340 | 7/1975 | Parker | 428/1 |
| 3,898,354 | 8/1975 | Parker | 428/1 |
| 4,597,636 | 7/1986 | Hoshikawa | 428/1 |

*Primary Examiner*—Ellis P. Robinson
*Assistant Examiner*—P. J. Ryan
*Attorney, Agent, or Firm*—Walter G. Finch

[57] ABSTRACT

An electronic component temperature monitoring system is provided for monitoring the temperature of electrical and electronic components and integrated circuit. This system, in one embodiment of the invention can consist of a temperature indicating decalcomania attached to the electrical and/or electronic component to be monitored. The decalcomania consists of a layer of nematic crystal material which as the time of manufacture is a milky substance. When the material is applied to a surface and let to dry, it becomes transparent and virtually undetectable. When the material is attahced to a electrical and/or electronic component, the crystal material reaches a set temperature, and becomes opaque in appearance and changes color with the fluctuation in temperature. The material is sandwiched between mylar, with a layer of adhesive opaque material is applied to the lower surface of the decalcomania. The combined layers are then cut into small sections.

In actual use, a section of the crystal material is placed on the top of an electrical and/or electronic component. When the component is heated, the color of the section changes, and this is an indication of the increase in temperature of the component. The electrical and/or electronic component can then be checked for safety and operability.

If integrated circuits and electrical and/or electronic components are to be checked, then the nematic cyrstal material is sprayed directly on the circuit and/or component. When the temperature of the circuit and/or component changes, the color of the nematic crystal material will change and the color is noted if action is to be taken.

6 Claims, 1 Drawing Sheet

ELECTRONIC COMPONENT OPERATING TEMPERATURE INDICATOR

BACKGROUND AND SUMMARY OF THE INVENTION

This invention relates to a temperature indicator device, and more particularly to a material for monitoring the temperature of electronic components, integrated electronic circuits and the like.

A nematic crystal material is, at the time of manufacture, a milky substance. When applied to a surface and let to dry, it becomes transparent and virtually undetectable. The crystal materials vary in temperature response and are carefully selected for the temperature range of interest.

In this case of application to electronic components, interest is in an indication range of approximately 35-75 degrees centigrade. When the crystal material reaches the set temperature, it becomes opague in appearance and changes colors with the fluctuations in temperature.

It is an object of this invention, therefore, to provide a nematic crystal material that can be used to monitor the temperature of electronic components, and integrated electronic circuits and the like.

Another object of this invention is to provide a monitoring material to determine the failure of electronic components and integrated electronic circuitry.

And even another object of this invention is to provide a monitoring material that is economical and efficient in operation, and which is easy to install on electronic components to be monitored for temperature behavior.

Still another object of this invention is to provide monitoring pads for determining the temperature of electronic components within a predetermined range.

DESCRIPTION OF THE PREFERRED EMBODIMENTS

Figure 3:
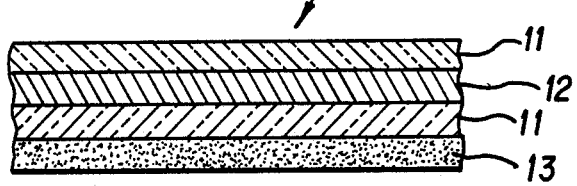
FIG. 3 is a cross section of a number of layers of nematic crystal material used for monitoring of electronic components.

Referring now to FIG. 3, there is shown a material 12 which is distributed onto a transparent surface 11, such as mylar and covered by another transparent surface 11 and left to dry. To enhance the viewing of the color changing crystals, an opaque dark coating 13 "can be" applied to the transparent surface 11.

Figure 4:
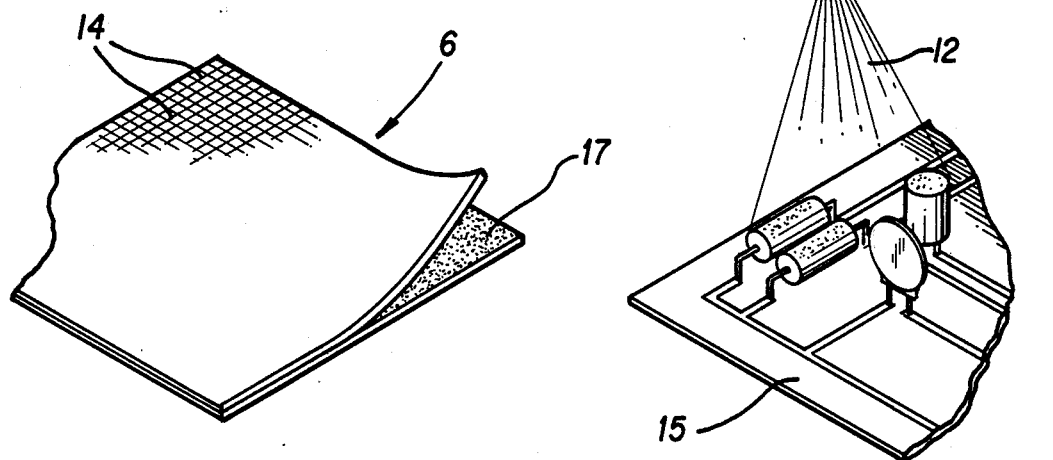
FIG. 4 is a perspective view of the layers of nematic crystal material used for monitoring of electronic components.

If the material 12 is going to be affixed to an already opaque surface, then a layer 13 can be made of clear adhesive material. The sheet of sandwiched material 6 can have a self-adhering and somewhat permanent adhesive 17 affixed to the underside of layer 11. The sheet 6 is then cut into small removable "decals 14" as shown in FIG. 4 for convenient application to electronic components.

Figure 1:
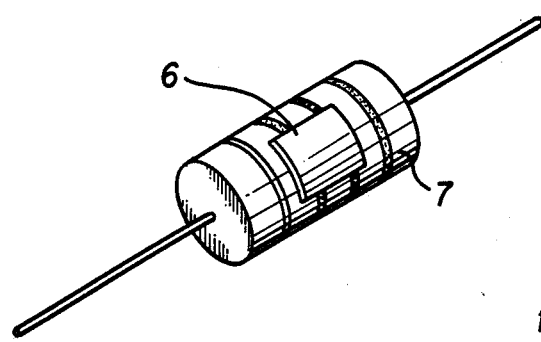
FIG. 1 is a perspective of a resistor or common electronic component.

One example of this concept is shown in FIG. 1. A resistor 7, a common electronic component, having a temperature indicating decal 6 adhered to its side. An opaque backing is supplied on this particular decal 6 because the resistor manufacturer supplies colored markings for other purposes.

When this resistor 7 is utilized in an electronic circuit, i.e. television receiver, computer etc., and is the subject of excessive power dissipation near the point of failure, the decal 6 will illuminate. With this, a repair person or the like, could readily notice this indication and remedy the fault for this occurrence.

Figure 2:
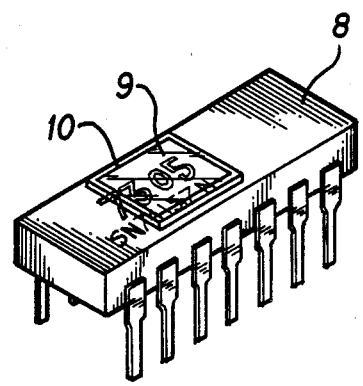
FIG. 2 is a perspective of an integrated circuit (I.C.)

Another example of electronic component temperature monitoring is shown in FIG. 2. An integrated circuit 8 or I.C. has been modified with a completely transparent temperature indicator decal 9. The decal 9 has a fixed colored band around its perimeter 10 to allow for the observer to unmistakeably identify the presence of the decal 9 while still permitting the legibility of the component manufacturers numbering information.

The colored band can also be coded to note the range to which the decal 9 is formulated for while not interfering with the decals operation. The integrated circuit has within it a wafer of minute transistors and the like encased directly beneath the decal 9. Any temperature changes will originate at this point and is the ideal location for the decal.

Since the surface of the integrated circuit package is already opaque from the manufacturers materials, the transparent decal does not require an opaque backing. Ideally, any overheat in the computer, TV, radio etc. of a single component or group of components, would be observed readily and investigated as to the cause of the overheat, i.e. improper cooling or individual component failure.

Figure 5:
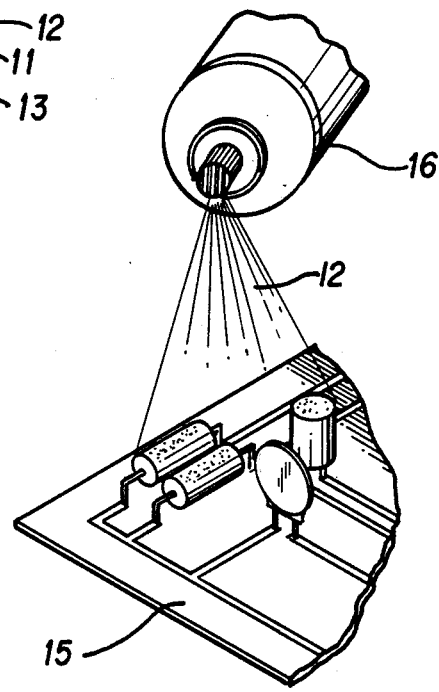
FIG. 5 is a perspective view illustrating a method for treating a integrated circuit with nematic crystal material.

In addition to using the decal technique, there is the direct application of the nematic crystal material exampled in FIG. 5. An integrated circuit under test 15 is in this case sprayed with an aerosol can 16 containing the nematic crystal material and a suitable propellant 12. When let to dry, the circuit 15 may appear untreated.

However, as the circuit 15 is energized and heat emission from power dissipation becomes more intense, the components will change color either indicating overheat or mild running conditions. The material after power down will then go back to its transparent state until washed off with a flushing solvent or re-energization of the circuit.

Finally, the nematic crystal material can be incorporated into the manufacture of electronic components. A small clear window can be included in the component package for viewing a sample of nematic crystals internal to the component and their color change. The range for the crystal change threshold can be formulated against the manufacturers specification for normal operations temperature.

The operation of the nematic crystal material is of no electrical dependency of the components used on, but instead the resultant heat from the already operating component. The nematic crystal material undergoes visual color changes from temperature changes of an electronic component whether it is due to environmental temperature change or increase component heat from its own power or heat dissipation.

As can be readily understood from the foregoing description of the invention, the present material can be configured in different modes to provide a method for temperature indication.

Accordingly, modifications and variations to which the invention is susceptible may be practiced without departing from the scope and intent of the appended claims.

What is claimed is:

1. An electric/electrical component temperature monitoring package, comprising, a layer of nematic crystal material, a layer of transparent material positioned on opposite sides of said nematic crystal material and in juxtaposition therewith, and an adhesive layer of opaque material positioned adjacent said lower layer of said transparent material and in juxtaposition therewith.

2. An electric/electrical component temperature monitoring package as recited in claim 1, wherein said layers of transparent material are formed of mylar.

3. An electric/electrical component temperature monitoring package as recited in claim 1, wherein said temperature monitoring package of layered material has a window in a electric/electrical component.

4. An electric/electrical component temperature monitoring package as recited in claim I, wherein said temperature monitoring package is positioned juxtaposition to an electric-electrical component, and an integrated circuit.

5. An electric/electrical component temperature monitoring integrated circuit package, comprising, a layer of nematic crystal material sprayed on the surface of said electronic component temperature monitoring integrated circuit.

6. A electric/electrical component temperature monitoring package as recited in claim 1, wherein said monitoring package temporarily changes color upon the application of excess temperature and returns to a transparent state after the excess temperature has been dissipated.

* * * * *